United States Patent
Maki et al.

(10) Patent No.: US 10,270,458 B2
(45) Date of Patent: Apr. 23, 2019

(54) QUANTUM INTERFERENCE DEVICE, ATOMIC OSCILLATOR, ELECTRONIC APPARATUS, AND VEHICLE

(71) Applicant: SEIKO EPSON CORPORATION, Tokyo (JP)

(72) Inventors: Yoshiyuki Maki, Suwa (JP); Nobuhito Hayashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 159 days.

(21) Appl. No.: 15/460,975

(22) Filed: Mar. 16, 2017

(65) Prior Publication Data

US 2017/0288687 A1    Oct. 5, 2017

(30) Foreign Application Priority Data

Mar. 29, 2016  (JP) ................. 2016-065214

(51) Int. Cl.
*H03B 17/00* (2006.01)
*H03L 1/02* (2006.01)
*H03L 7/26* (2006.01)

(52) U.S. Cl.
CPC .............. *H03L 7/26* (2013.01); *H03B 17/00* (2013.01); *H03L 1/02* (2013.01)

(58) Field of Classification Search
CPC ........... G04F 5/14; G04F 5/145; H03B 17/00; H03L 1/02; H03L 7/26
USPC ........................................ 331/3, 68–70, 94.1
See application file for complete search history.

(56) References Cited

U.S. PATENT DOCUMENTS

| 4,405,905 | A | * | 9/1983 | Busca | ........................ H03L 7/26 331/3 |
| 4,494,085 | A | * | 1/1985 | Goldberg | ............. G01N 24/006 324/304 |
| 5,670,914 | A | * | 9/1997 | Liberman | ................. G04F 5/14 250/251 |
| 6,265,945 | B1 | * | 7/2001 | Delaney | .................. G04F 5/145 331/3 |
| 7,215,213 | B2 | | 5/2007 | Mescher et al. | |
| 2009/0066430 | A1 | * | 3/2009 | Braun | ........................ G04F 5/14 331/94.1 |
| 2014/0232478 | A1 | * | 8/2014 | Maki | ...................... H03B 17/00 331/94.1 |

(Continued)

FOREIGN PATENT DOCUMENTS

JP          4972550 B2    7/2012
JP     2012-195351 A   10/2012

(Continued)

*Primary Examiner* — Levi Gannon
(74) *Attorney, Agent, or Firm* — Oliff PLC

(57) ABSTRACT

A quantum interference device includes an atom cell, a light source emits light to the alkali metal atoms, a photodetector that detects the light transmitted through the atom cell, a thermal conductor, which is disposed so as to straddle the light source side and the photodetector side of the atom cell, and the thermal conductor having higher thermal conductively than the atom cell, and a support, which is disposed so as to be separated from the thermal conductor, and supports the atom cell, the light source, the photodetector, and the thermal conductor in a lump, the support having lower thermal conductivity than the thermal conductor.

10 Claims, 9 Drawing Sheets

(56) References Cited

U.S. PATENT DOCUMENTS

| | | | |
|---|---|---|---|
| 2014/0232479 A1* | 8/2014 | Maki | H01S 1/06 331/94.1 |
| 2015/0102863 A1* | 4/2015 | Hashi | H03L 7/26 331/94.1 |
| 2015/0180490 A1* | 6/2015 | Chindo | H03L 7/26 331/94.1 |
| 2015/0214895 A1* | 7/2015 | Hashi | G04F 5/14 331/94.1 |

FOREIGN PATENT DOCUMENTS

| | | |
|---|---|---|
| JP | 2015-170882 A | 9/2015 |
| WO | 2006017345 A2 | 2/2006 |

* cited by examiner

QUANTUM INTERFERENCE DEVICE, ATOMIC OSCILLATOR, ELECTRONIC APPARATUS, AND VEHICLE

CROSS-REFERENCE TO RELATED APPLICATIONS

This application claims priority to Japanese Patent Application No. 2016-065214, filed Mar. 29, 2016, the entirety of which is hereby incorporated by reference.

BACKGROUND

1. Technical Field

Various embodiments of the present invention relate to a quantum interference device, an atomic oscillator, an electronic apparatus, and a vehicle.

2. Related Art

As an oscillator having an accurate oscillation characteristic for a long period of time, there has been known an atomic oscillator, which oscillates based on the energy transition of an atom of alkali metal such as rubidium or cesium (see, e.g., Japanese Patent No. 4,972,550. Further, the atomic oscillator using the quantum interference effect can be miniaturized more easily than the atomic oscillator using the double resonance phenomenon, and is therefore expected to be mounted on a variety of types of apparatuses in recent years.

For example, the atomic oscillator described in Japanese Patent No. 4,972,550 is provided with a chip-scale device having a light source, a photodetector device, and a steam cell (an atom cell) integrated with each other, and a suspension device for suspending the chip-scale device. By integrating the light source, the photodetector device, and the steam cell with each other, it is possible to achieve the miniaturization and reduction in power consumption of the atomic oscillator.

In the atomic oscillator described in Japanese Patent No. 4,972,550, due to release of the heat from the chip-scale device to the suspension device, a temperature difference between a surface of the steam cell located on the light source side and a surface thereof located on the photodetector device side, and a temperature fluctuation in the light source are caused, and as a result, there is a problem that the characteristics of the atomic oscillator are deteriorated.

SUMMARY

An advantage of some aspects of the invention is to provide a quantum interference device capable of achieving the reduction in size and the reduction in power consumption while making the characteristics excellent, and further provide an atomic oscillator, an electronic apparatus, and a vehicle each equipped with the quantum interference device.

The advantage described above is achieved by the following configurations.

A quantum interference device according to an aspect of the invention includes an atom cell in which alkali metal atoms are encapsulated, a light source adapted to emit light adapted to excite the alkali metal atoms, a photodetector adapted to detect the light having been transmitted through the atom cell, a thermal conductor, which is disposed so as to straddle the light source side and the photodetector side of the atom cell, and is formed using a material higher in thermal conductively than the atom cell, and a support, which is disposed so as to be separated from the thermal conductor, formed using a material lower in thermal conductivity than the thermal conductor, and supports the atom cell, the light source, the photodetector, and the thermal conductor in a lump.

According to such an atomic oscillator 1 as described above, since the thermal conductor, which is formed using the material higher in thermal conductivity than the atom cell, is disposed so as to straddle the light source side and the photodetector side of the atom cell, it is possible to reduce the temperature difference between the surface of the atom cell located on the light source side and the surface located on the photodetector side, and to accurately control the temperature of the light source irrespective of the number and the arrangement of the heaters for heating the atom cell, in particular, even in the case in which the number of the heaters is one. Therefore, it is possible to make the characteristics of the quantum interference device excellent.

Further, since the support, which is formed using the material lower in thermal conductivity than the thermal conductor, supports the atom cell, the light source, the photodetector, and the thermal conductor in a lump, it is possible to achieve the miniaturization of the quantum interference device, and at the same time to reduce the release of the heat from the atom cell, the light source, the photodetector, and the thermal conductor to thereby achieve the reduction in power consumption of the quantum interference device.

Moreover, since the support is separated from the thermal conductor, it is possible to effectively reduce the release of the heat from the thermal conductor to the support. Therefore, the effect of making the characteristics of the quantum interference device excellent by the thermal conductor described above, and the effect of achieving the reduction in power consumption of the quantum interference device by the support described above can each be exerted in a favorable manner.

In the quantum interference device according to the aspect of the invention, it is preferable that the support includes a first support part adapted to support one of the atom cell and the light source on the light source side with respect to the atom cell, and a second support part adapted to support one of the atom cell and the photodetector on the photodetector side with respect to the atom cell.

With this configuration, it is possible to stably support the atom cell, the light source, and the photodetector.

In the quantum interference device according to the aspect of the invention, it is preferable that there is further included a heater supported by the support together with the atom cell, the light source, the photodetector, and the thermal conductor in a lump, and adapted to heat the light source and the atom cell via the thermal conductor.

With this configuration, it is possible to perform the accurate temperature control on the atom cell and the light source using the heat from the heater.

In the quantum interference device according to the aspect of the invention, it is preferable that the heater is disposed on the photodetector side with respect to the atom cell.

With this configuration, interconnections for the heater can be arranged on the same side as interconnections for the photodetector. Further, as described above, even in the case in which the distance between the heater and the light source increases, it is possible to efficiently transfer the heat from the heater to the light source due to the thermal conductor.

In the quantum interference device according to the aspect of the invention, it is preferable that the heater is disposed on the light source side with respect to the atom cell.

With this configuration, the interconnections for the heater can be arranged on the same side as interconnections for the light source. Further, it is possible to decrease the distance between the heater and the light source to thereby perform more accurate temperature control on the light source. As a result, it is possible to efficiently reduce the wavelength fluctuation of the light due to the temperature fluctuation of the light source.

In the quantum interference device according to the aspect of the invention, it is preferable that a distance between the heater and the light source is shorter than a distance between the heater and the atom cell.

With this configuration, it is possible to make the heater come closer to the light source than to the atom cell. Therefore, it is possible to perform further accurate temperature control on the light source.

In the quantum interference device according to the aspect of the invention, it is preferable that the distance between the heater and the light source is longer than the distance between the heater and the atom cell.

With this configuration, it is possible to dispose the heater in the vicinity of the center of the structure including the atom cell and the light source. Therefore, it is possible to easily homogenize the temperature distribution between the surface of the atom cell located on the light source side, the surface of the atom cell located on the photodetector side, and the light source.

In the quantum interference device according to the aspect of the invention, it is preferable that there is further included wiring connected to one of the heater and the light source, the thermal conductor is disposed outside a space housing one of the heater and the light source, and the wiring has a part extending from the first support part to an inside of the space so as to be separated from the thermal conductor, and connected to one of the heater and the light source.

With this configuration, it is possible to reduce the radiation from the wiring for the heater or the light source. As a result, the reduction in power consumption of the quantum interference device can effectively be achieved.

In the according to the aspect of the invention, it is preferable that the quantum interference device further includes a container forming a space housing the atom cell, the light source, the photodetector, the heater, the thermal conductor, and the support, and the thermal conductor is separated from the container.

With this configuration, it is possible to reduce the transfer of the heat from the atom cell, the light source, the photodetector, and the heater to the container via the thermal conductor.

An atomic oscillator according to another aspect of the invention includes the quantum interference device according to the aspect of the invention.

According to such an atomic oscillator as described above, it is possible to achieve the reduction in power consumption while making the characteristics excellent.

An electronic apparatus according to another aspect of the invention includes the quantum interference device according to the aspect of the invention.

According to such an electronic apparatus as described above, it is possible to achieve the reduction in power consumption while making the characteristics of the quantum interference device excellent.

A vehicle according to another aspect of the invention includes the quantum interference device according to the aspect of the invention.

According to such a vehicle as described above, it is possible to achieve the reduction in power consumption while making the characteristics of the quantum interference device excellent.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a vehicle according to the invention will be described in detail based on some preferred embodiments shown in the accompanying drawings.

1. Atomic Oscillator

Firstly, the atomic oscillator (atomic oscillator equipped with the quantum interference device according to the invention) according to the invention will be described. It should be noted that although an example of applying the quantum interference device according to the invention to the atomic oscillator will hereinafter be described, the quantum interference device according to the invention can be applied not only to the atomic oscillator, but also to, for example, a magnetic sensor and a quantum memory.

First Embodiment

Figure 1:
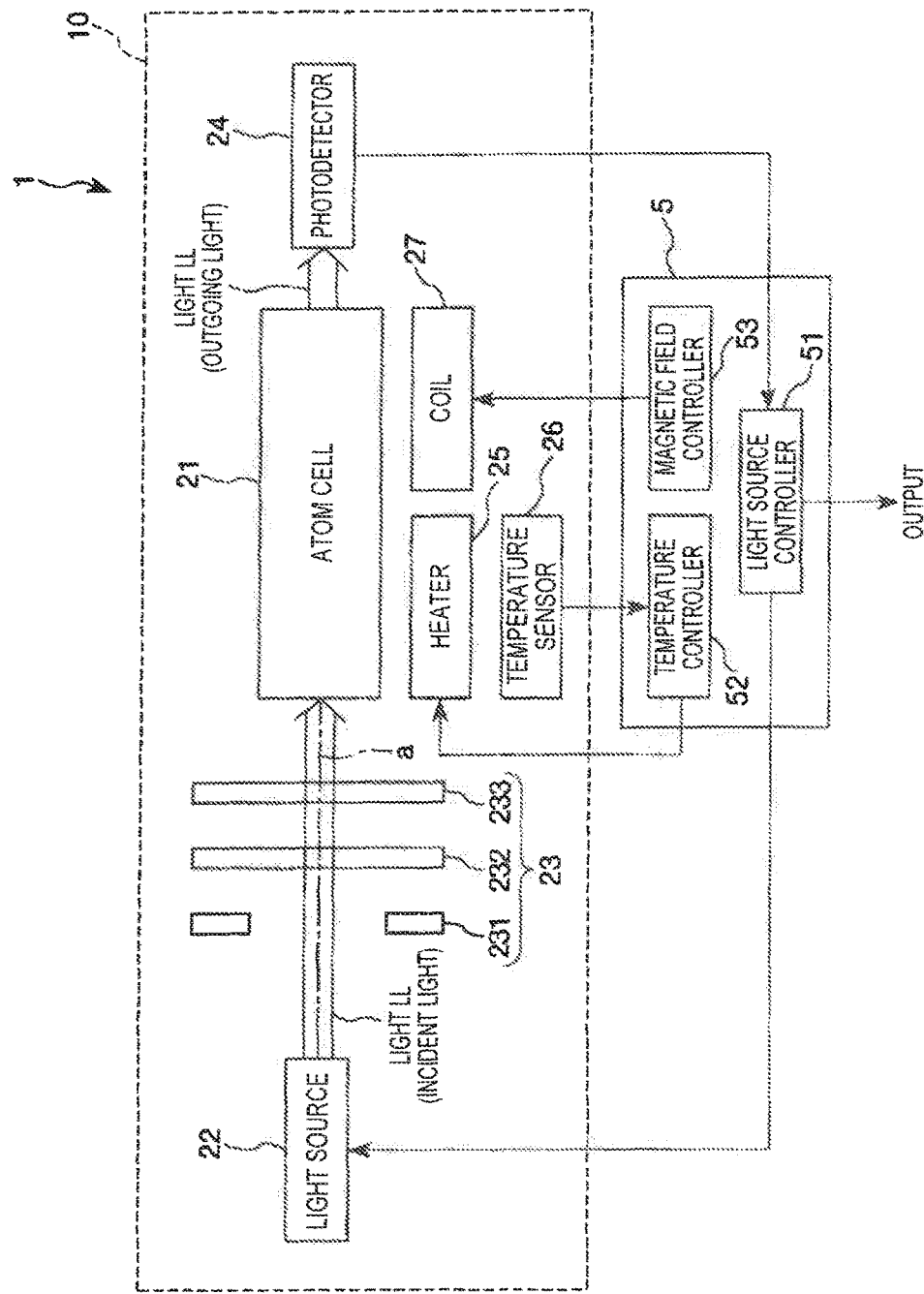
FIG. 1 is a schematic configuration diagram showing an atomic oscillator according to first embodiment.

FIG. 1 is a schematic configuration diagram showing the atomic oscillator according to a first embodiment of the invention.

The atomic oscillator 1 shown in FIG. 1 is an atomic oscillator using the quantum interference effect (coherent population trapping (CPT)) with which there occurs a phenomenon that when irradiating an alkali metal atom with two resonance light beams having specific wavelengths different from each other at the same time, the two resonance light beams are transmitted through the alkali metal atom without being absorbed by the alkali metal atom. It should be noted that the phenomenon due to the quantum interference effect is also referred to as electromagnetically induced transparence (EIT) phenomenon.

As shown in FIG. 1, the atomic oscillator 1 has a package 10 for causing the quantum interference effect, and a controller 5 for controlling the package 10. Here, the package 10 has an atom cell 21, a light source 22, an optical system 23, a photodetector 24, a heater 25, a temperature sensor 26, and a coil 27. Further, the controller 5 has a light source controller 51, a temperature controller 52, and a magnetic field controller 53. Firstly, an outline of the atomic oscillator 1 will hereinafter be described.

In the atomic oscillator 1, the light source 22 irradiates the atom cell 21 with the light LL along an optical axis a via the optical system 23, and the photodetector 24 detects the light LL having been transmitted through the atom cell 21.

The atom cell 21 has a light transmissive property, and alkali metal (alkali metal atoms) is encapsulated in the atom cell 21. The alkali metal has energy levels of three-level system comprising two ground levels different from each other, and an excited level. Further, the alkali metal in the atom cell 21 is heated by the heater 25, and at least a part of the alkali metal becomes in a gas state. Further, a magnetic field in a desired direction is applied from the coil 27 to the alkali metal in the atom cell 21, and thus, the alkali metal in the atom cell 21 is in the Zeeman split state.

The light LL emitted from the light source 22 includes two types of light different in frequency from each other. These two types of light cause the EIT phenomenon when the two types of light become a resonance light pair having the frequency difference coinciding the frequency corresponding to the difference in energy between the two ground levels of the alkali metal in the atom cell 21.

The light source controller 51 controls the frequencies of the two types of light included in the light LL emitted from the light source 22 described above so as to cause the EIT phenomenon based on the detection result of the photodetector 24. Further, the light source controller 51 is provided with a voltage-controlled crystal oscillator (not shown), the oscillation frequency of which is controlled in accordance with the detection result of the photodetector 24. Further, the output signal of the voltage-controlled crystal oscillator (VCXO) is output as a clock signal of the atomic oscillator 1.

Further, the temperature controller 52 controls the energization to the heater 25 based on the detection result of the temperature sensor 26 for detecting the temperature of the atom cell 21 so that the temperature in the atom cell 21 becomes a desired level. Further, the magnetic field controller 53 controls the energization to the coil 27 so that the magnetic field generated by the coil 27 becomes constant.

Such a controller 5 is disposed in, for example, an IC chip mounted on a board on which the package 10 is mounted. It should be noted that it is also possible for the controller 5 to be provided to the package 10.

Hereinabove, the schematic configuration of the atomic oscillator 1 is described. Hereinafter, the package 10 provided to the atomic oscillator 1 will be described in detail.

Figure 2:
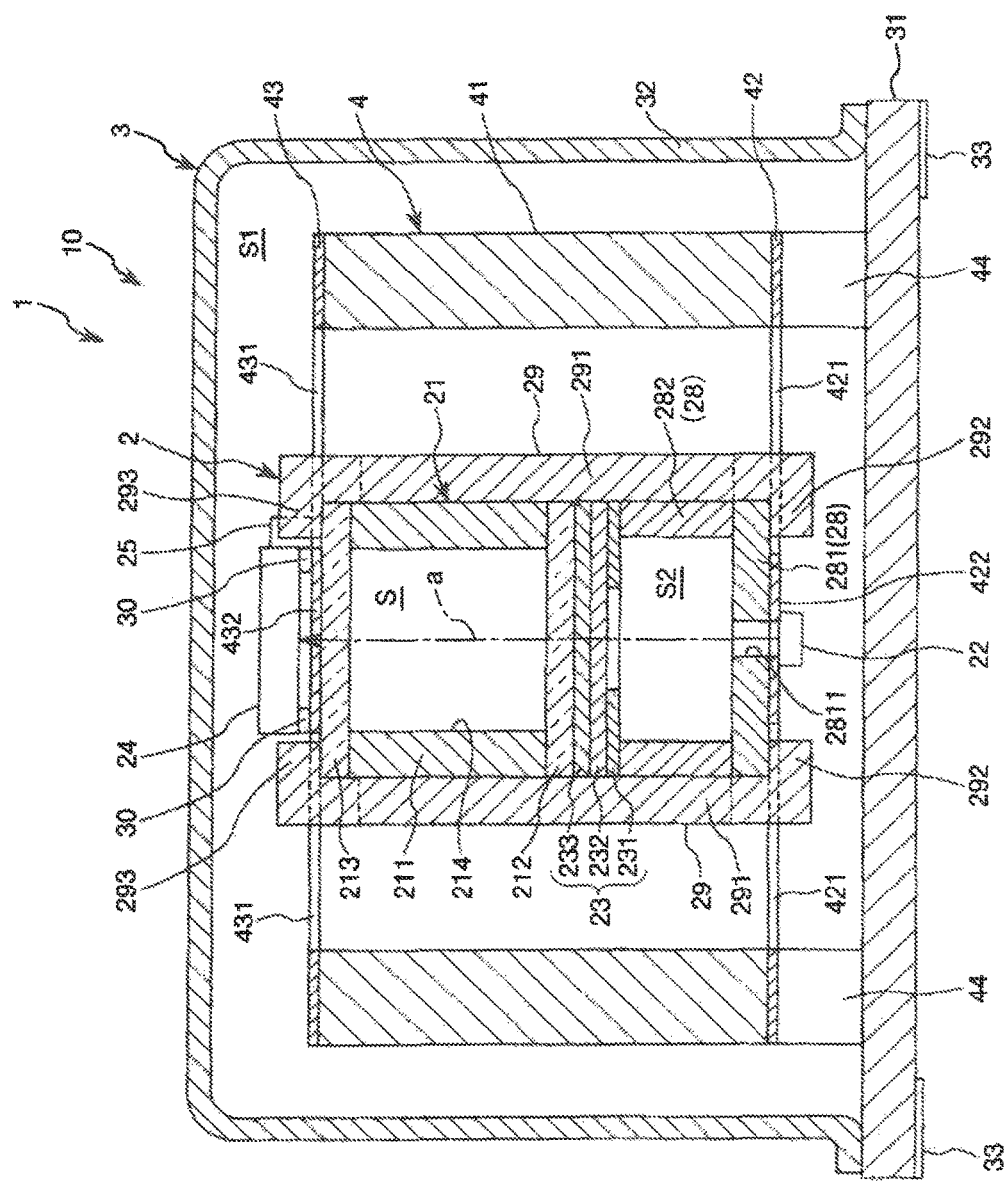
FIG. 2 is a cross-sectional view showing a schematic configuration of a package provided to the atomic oscillator shown in FIG. 1.
Figure 3:
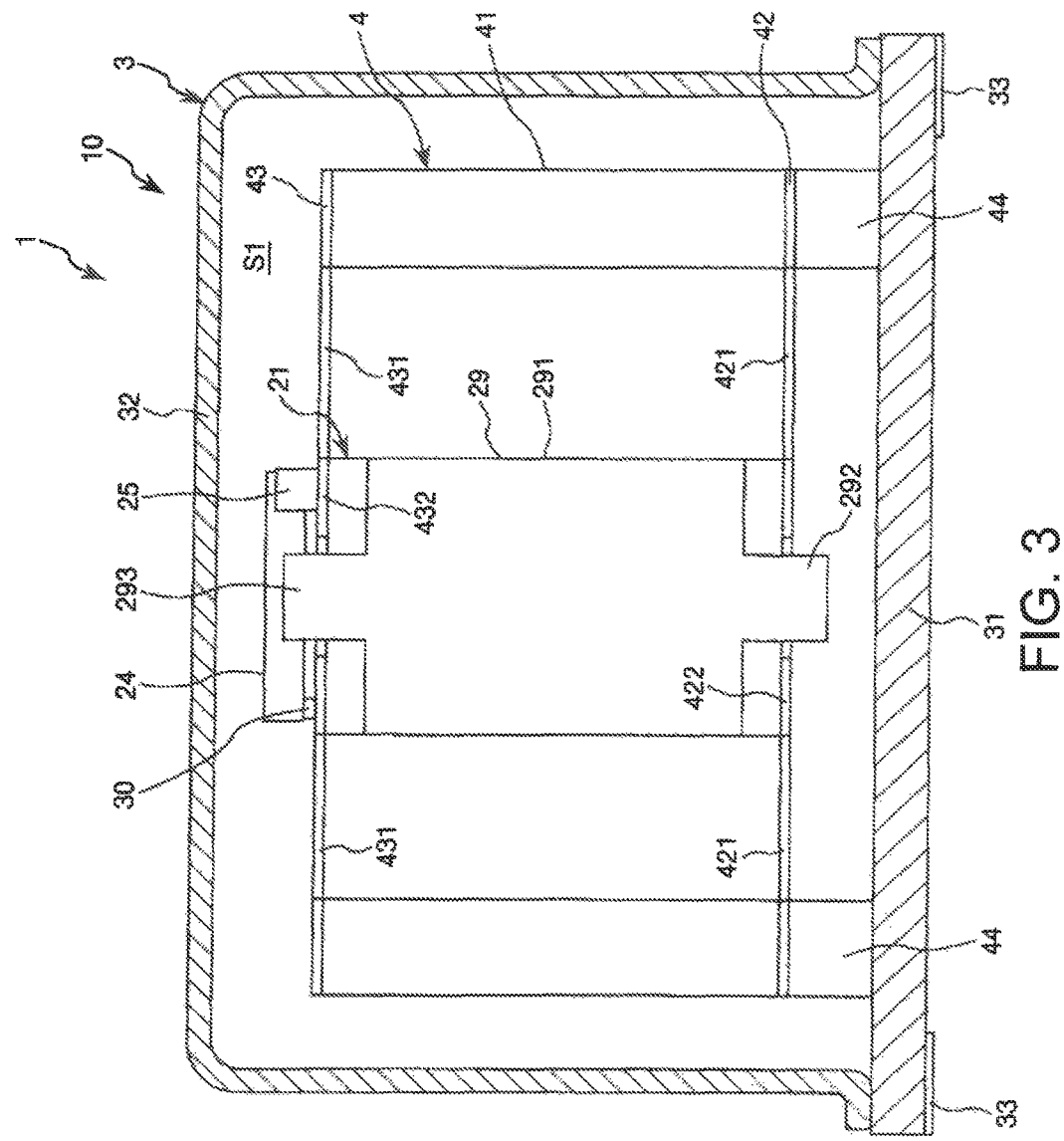
FIG. 3 is a partial cross-sectional side view of an atom cell unit and a support provided to the package shown in FIG. 2.
Figure 4:
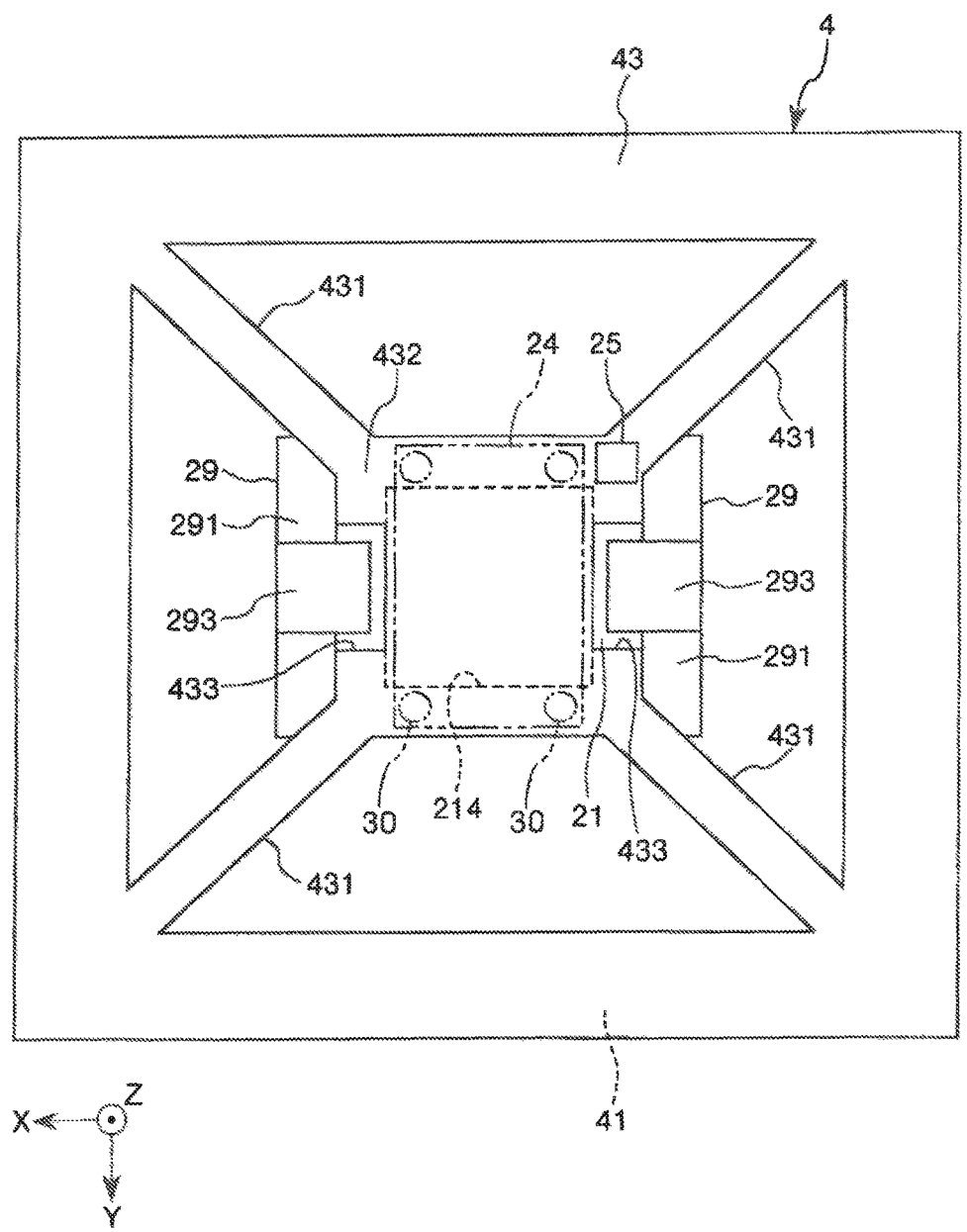
FIG. 4 is a plan view (a top view) of the atom cell unit and the support provided to the package shown in FIG. 2.

FIG. 2 is a cross-sectional view showing a schematic configuration of the package provided to the atomic oscillator shown in FIG. 1. FIG. 3 is a partial cross-sectional side view of an atom cell unit and a support provided to the package shown in FIG. 2. FIG. 4 is a plan view (a top view) of the atom cell unit and the support provided to the package shown in FIG. 2. It should be noted that, in each of the drawings, an X axis, a Y axis, and a Z axis perpendicular to each other are illustrated by arrows, and the tip side of each of the arrows is defined as "+," and the base end side is defined as "−" for the sake of convenience of explanation. Further, a direction parallel to the X axis is referred to as an "X-axis direction," a direction parallel to the Y axis is referred to as a "Y-axis direction," and a direction parallel to the Z axis is referred to as a "Z-axis direction." Further, the upper side (+Z-axis direction side) in FIG. 2 is referred to as an "upper side," and the lower side (−Z-axis direction side) is referred to as a "lower side."

As shown in FIG. 2, the package 10 provided to the atomic oscillator 1 is provided with an atom cell unit 2 for causing such a quantum interference effect as described above, a container 3 for housing the atom cell unit 2, and a support 4, which is housed in the container 3, and supports the atom cell unit 2 with respect to the container 3. It should be noted that it is also possible for a magnetic shield to be disposed on the outer side of the container 3 as needed. Hereinafter, each of the parts of the package 10 will sequentially be described.

Atom Cell Unit

The atom cell unit 2 includes the atom cell 21, the light source 22, the optical system 23, the photodetector 24, the heater 25, a spacer 28, and a pair of thermal conductors 29, and these constituents are unitized. It should be noted that although in FIG. 2, the temperature sensor 26 and the coil 27 shown in FIG. 1 are omitted from the illustration, the temperature sensor 26 is, for example, a thermistor or a thermocouple, and is disposed in the vicinity of the light source 22 or the heater 25. Further, the coil 27 can be disposed in the atom cell unit 2, or can also be disposed outside the atom cell unit 2, and in the case of disposing the coil 27 outside the atom cell unit 2, the coil 27 can be located inside the container 3, or can also be located outside the container 3.

Spacer

The spacer 28 has a box-like shape opened upward. The spacer 28 has a base 281 shaped like a plate, and a frame 282 erected in an outer peripheral part of the base 281, and a space S2 is formed inside the frame 282. It should be noted that the base 281 and the frame 282 can be formed integrally.

The base 281 and the frame 282 are each formed of a material superior in thermal conductivity. Specifically, the constituent material of the base 281 and the frame 282 is not particularly limited, but there can be cited, for example, a ceramics material and a metal material, and it is possible to use either one of these materials alone, or two or more of these materials in combination. Further, as the constituent material of each of the base 281 and the frame 282, it is preferable to use a nonmagnetic material in order not to hinder the magnetic field from the coil 27.

The base 281 has a hole 2811 penetrating in the thickness direction disposed at the central part of the base 281. Further, on the lower surface of the base 281, there is disposed the light source 22 so as to block the opening of the hole 2811. Here, the light source 22 has a light emitting surface facing to the base 281, and the light LL emitted from the light source 22 enters the space S2 through the hole 2811. Further, to an upper end part of the frame 282, there is connected the atom cell 21 via the optical system 23. Thus, the light LL from the light source 22 enters the atom cell 21 via the optical system 23.

Such a spacer 28 has a function of supporting the light source 22, and at the same time defining the distance between the light source 22 and the atom cell 21. Further, the spacer 28 has a function of transferring the heat between the pair of thermal conductors 29 and the light source 22. It can also be said that such a spacer 28 constitutes a part of the pair of thermal conductors 29.

Light Source

The light source 22 has a function of emitting the light LL capable of exciting the alkali metal atoms in the atom cell 21. The light source 22 is not particularly limited as long as the light source 22 can emit the light LL including such resonance light pair as described above, and it is preferable to use a light emitting element such as a semiconductor laser such as a vertical cavity surface emitting laser (VCSEL).

Optical System

The optical system 23 is disposed between the light source 22 and the atom cell 21, and is fixed to the atom cell 21 or the spacer 28. The optical system 23 has a light-blocking member 231 and optical components 232, 233. In the present embodiment, the light-blocking member 231, the optical component 232, and the optical component 233 are disposed in this order along the optical axis a from the light source 22 side toward the atom cell 21.

The light-blocking member 231 is a film-like member having a light-blocking property, and is disposed on one surface of the optical component 232. The constituent material of the light-blocking member 231 is not particularly limited providing the material has a light-blocking property, and, for example, a resin material, and a metal material can be used therefor. Further, it is preferable for the light-blocking member 231 to be provided with an antireflection property from a viewpoint of preventing the light LL having entered the light-blocking member 231 from becoming stray light. Further, the light-blocking member 231 can be formed on the optical component 232 using a known deposition method.

The light-blocking member 231 has an opening for partially transmitting the light LL, and the part except the opening has a light-blocking property. The shape of the opening is determined in accordance with the lateral cross-sectional shape of the internal space S described above, and is not particularly limited, but has, for example, a circular shape or a rectangular shape. By transmitting the light LL through such an opening of the light-blocking member 231, it is possible to adjust the shape of the light LL entering the internal space S, and at the same time achieve homogenization of the intensity distribution in the width direction of the light LL.

The optical component 232 is a neutral density filter (ND filter). Thus, it is possible to adjust (decrease) the intensity of the light LL entering the atom cell 21. Therefore, even in the case in which the output of the light source 22 is high, it is possible to set the intensity of the light LL entering the atom cell 21 to a desired level.

The optical component 233 is a ¼ wave plate. Thus, it is possible to convert the light LL from the light source 22 from linearly polarized light to circularly polarized light (right circularly polarized light or left circularly polarized light). By using the light LL circularly polarized, it is possible to increase the number of atoms developing the desired EIT phenomenon to increase the intensity of the desired EIT signal. As a result, the oscillation characteristics of the atomic oscillator 1 can be improved.

It should be noted that the optical system 23 can also be provided with other optical components such as a lens or a polarization plate besides the light-blocking member 231 and the optical components 232, 233 described above. Further, depending on the intensity of the light LL from the light source 22, the optical component 232 can be eliminated. Further, depending on the radiation angle, the spot shape, and so on of the light LL from the light source 22, the light-blocking member 231 can be eliminated. Further, the arrangement order of the light-blocking member 231, and the optical components 232, 233 is not limited to the order described above, but is arbitrary.

Atom Cell

As shown in FIG. 2, the atom cell 21 has a body 211 provided with a through hole 214 having a cylindrical shape, and a pair of light transmissive parts 212, 213 for blocking the openings on the both sides of the through hole 214. Thus, there is formed an internal space S in which the gaseous alkali metal such as rubidium, cesium, or sodium is encapsulated. It should be noted that, in the internal space S, a noble gas such as argon or neon, or an inert gas such as nitrogen can also be encapsulated as a buffer gas together with the alkali metal gas if needed. Further, the shape of the lateral cross-sectional surface (the cross-sectional surface in a direction perpendicular to the optical axis a) of the through hole 214, namely the shape of the lateral cross-sectional surface of the internal space S, is not particularly limited, but there can be cited, for example, a circular shape, an elliptical shape, and a polygonal shape such as a rectangular shape.

Each of the light transmissive parts 212, 213 has permeability with respect to the light LL from the light source 22. Then, through the one light transmissive part 212, there is transmitted the light LL entering the internal space S, and through the other light transmissive part 213, there is transmitted the light LL emitted from the internal space S. The constituent material of the light transmissive parts 212, 213 is not particularly limited, but there can be cited, for example, a glass material and a quartz crystal.

Further, the constituent material of the body 211 of the atom cell 21 is not particularly limited, but there can be cited a silicon material, a ceramics material, a metal material, a resin material, a glass material, a quartz crystal, and so on.

Further, each of the light transmissive parts 212, 213 are airtightly bonded to the body 211. Thus, the internal space S of the atom cell 21 can be made to be an airtight space. The bonding method of the body 211 of the atom cell 21 and the light transmissive parts 212, 213 is determined in accordance with the constituent materials of these parts, and is not particularly limited, but there can be used, for example, a bonding method with an adhesive, a direct bonding method, and an anodic bonding method.

Photodetector

The photodetector 24 is disposed on the opposite side to the light source 22 with respect to the atom cell 21. The photodetector 24 has a function of detecting the intensity of the light LL (more specifically, the resonance light pair) having been transmitted through the atom cell 21. The photodetector 24 is not particularly limited providing such light LL as described above can be detected, and a photodetector device (a light receiving element) such as a solar cell or a photodiode can be used as the photodetector 24.

Heater

The heater 25 has a heating resistive element (heating part) for generating heat due to energization. The heater 25 is disposed on the opposite side to the light source 22 with respect to the atom cell 21. Further, the heat from the heater 25 is directly transferred to the light transmissive part 213 of the atom cell 21, and at the same time transferred to the light transmissive part 212 of the atom cell 21 via the pair of thermal conductors 29. Further, the heat from the heater 25 is also transferred to the light source 22 via the pair of thermal conductors 29 and the spacer 28.

It should be noted that the heater 25 is disposed on a connector 432 of a sheet 43 of the support 4 as described later, but can also be formed of an interconnection provided to the connector 432.

Thermal Conductor (Fixation Member)

As shown in FIG. 2, the pair of thermal conductors 29 are disposed so as to sandwich the atom cell 21 in the X-axis direction. Further, each of the thermal conductors 29 is disposed so as to straddle the light source 22 side and the photodetector 24 side of the atom cell 21. Further, the pair of thermal conductors 29 are each formed so as not to overlap a passing area of the light LL. The thermal conductors 29 shown in FIG. 2 each have a recess, into which the atom cell 21 is fitted. Due to the fitting, the atom cell 21 is fixed to the thermal conductors 29. Further, to one end surface of the thermal conductor 29, there is fixed the spacer 28, on which the light source 22 is disposed, with an adhesive or the like. Further, to the other end surface of the thermal conductor 29, there is fixed the atom cell 21, on which the photodetector 24 is disposed, with an adhesive or the like. As described above, the thermal conductors 29 fix the relative positional relationship between the atom cell 21, the light source 22, and the photodetector 24.

In more specific description, each of the thermal conductors 29 has a first part 291 extending along a stacking direction (the Z-axis direction) of a layered body formed of the atom cell 21, the optical system 23, and the spacer 28, a second part 292 projecting from one end part (an end part on the −Z-axis direction side) of the first part 291 toward the optical axis a, and a third part 293 projecting from the other end part (an end part on the +Z-axis direction side) of the first part 291 toward the optical axis a. The second part 292 disposed on the light source 22 side with respect to the atom cell 21 and the third part 293 disposed on the photodetector 24 side with respect to the atom cell 21 are connected to each other via the first part 291, and thus such a thermal conductor 29 is disposed so as to straddle the light source 22 side and the photodetector 24 side of the atom cell 21.

As shown in FIG. 3, an end part of the first part 291 located on the second part 292 side, and an end part of the first part 291 located on the third part 293 side are each made thinner in the width along the Y-axis direction than the central part of the first part 291 so as not to have contact with the support 4. To such both end parts of the first part 291 as describe above, there are respectively connected the second part 292 and the third part 293.

As shown in FIG. 2, the second part 292 has contact with a surface of the base 281 of the spacer 28 located on the opposite side to the frame 282. By making the spacer 28 and the thermal conductors 29 have contact with each other, it is possible to efficiently transfer the heat between the spacer 28 and the thermal conductors 29. The third part 293 has contact with a surface of the light transmissive part 213 of the atom cell 21 located on the opposite side to the internal space S. By making the atom cell 21 and the thermal conductors 29 have contact with each other, it is possible to efficiently transfer the heat between the atom cell 21 and the thermal conductors 29. Further, the third part 293 is disposed in the vicinity of the heater 25. Thus, it is possible to more efficiently transfer the heat from the heater 25 to the thermal conductors 29. It should be noted that the heater 25 can have contact with the thermal conductors 29.

Further, similarly to the both end parts of the first part 291 described above, the width along the Y-axis direction of the second part 292 and the third part 293 is made narrower than that of the central part of the first part 291 so as not to have contact with the support 4.

It should be noted that the thermal conductors 29 are not limited to those shown in the drawings providing the thermal conductors are disposed so as to straddle the light source 22 side and the photodetector 24 side of the atom cell 21. Further, the pair of thermal conductors 29 can be integrated with each other as a single member, or each of the thermal conductors 29 can be constituted by a plurality of members. Further, the thermal conductors 29 can be formed integrally with at least either one of the base 281 and the frame 282 of the spacer 28 described above.

Such a pair of conductors 29 as described above each thermally connect the heater 25 and the light transmissive part 212 of the atom cell 21 to each other. Thus, the heat from the heater 25 disposed on the light transmissive part 213 side of the atom cell 21 can be transferred to the light transmissive part 212 due to the thermal conduction by the pair of thermal conductors 29 to thereby reduce the temperature difference between the light transmissive parts 212, 213.

Further, the pair of thermal conductors 29 each thermally connect the heater 25 and the light source 22 to each other. Thus, the heat from the heater 25 disposed on the light transmissive part 213 side of the atom cell 21 is transferred to the light source 22 due to the thermal conduction by the pair of thermal conductors 29, and thus the accurate temperature control of the light source 22 becomes possible. It should be noted that in the present specification, the expression "thermally connect" means the state in which two members can achieve the thermal conduction with a loss no higher than 5% therebetween, and includes not only the case in which the two members have contact with each other, but also the case in which another member intervenes between the two members.

As a constituent material of each of such thermal conductors 29 as described above, it is preferable to use a material superior in thermal conductivity such as a metal material. Further, in order not to hinder the magnetic field from the coil 27, it is preferable to use a nonmagnetic material as the constituent material of the thermal conductors 29.

Container

As shown in FIG. 2, the container 3 has a function of housing the atom cell unit 2 and the support 4. It should be noted that other components than the components described above can also be housed in the container 3.

As shown in FIG. 2, the container 3 is provided with a base 31 having a plate-like shape and a lid 32 having a bottomed cylindrical shape, and the opening of the lid 32 is closed by the base 31. Thus, there is formed an internal space S1 for housing the atom cell unit 2 and the support 4. Here, the lid 32 is separated from the atom cell unit 2 and the support 4. Thus, it is possible to reduce the thermal interference between the atom cell unit 2 and the lid 32.

The base 31 supports the atom cell unit 2 on the upper surface of the base 31 via the support 4. Further, the base 31 is, for example, a wiring board, and on a surface (the lower surface) of the base 31 located on the opposite side to the support 4, there is disposed a plurality of external terminals 33. The plurality of external terminals 33 is electrically connected to a plurality of internal terminals (not shown) disposed on the upper surface of the base 31 via interconnections not shown.

The constituent material of the base 31 is not particularly limited, but there can be used, for example, a resin material and a ceramics material, and it is preferable to use the ceramics material. Thus, it is possible to make the airtightness of the internal space S1 excellent while realizing the base 31 for constituting the wiring board.

The lid 32 is bonded to such a base 31 as described above. The bonding method of the base 31 and the lid 32 is not particularly limited, but there can be used, for example, brazing, seam welding, and energy beam welding (e.g., laser welding and electron beam welding). It should be noted that it is possible for a bonding member for bonding the base 31 and the lid 32 to each other to intervene between the base 31 and the lid 32.

Such an internal space S1 of the container 3 as described above is an airtight space. In particular, the internal space S1 is in a reduced-pressure state (a vacuum state) reduced in pressure from the atmospheric pressure. Thus, the transfer of the heat between the atom cell unit 2 and the container 3 via the internal space S1 can effectively be suppressed. Therefore, it is possible to reduce the temperature variation of the atom cell unit 2 due to the external temperature variation of the container 3, and to reduce the power consumption of the heater 25.

The constituent material of such a lid 32 as described above is not particularly limited, but there can be used, for example, a resin material, a ceramics material, and a metal material, and it is preferable to use the metal material such as Kovar, 42-alloy, or stainless steel. Thus, it is possible to make the airtightness of the internal space S1 excellent while realizing the lid 32 having a magnetic shield property.

Support

The support 4 has a function of supporting the atom cell unit 2 described above with respect to the base 31 of the container 3. Further, the support 4 has a function of reducing the heat transfer between the atom cell unit 2 and the outside. Thus, it is possible to accurately perform the temperature control of the atom cell 21, the light source 22, and so on.

In the detailed description, as shown in FIG. 2, the support 4 has a frame 41, two sheets 42, 43, and legs 44.

As shown in FIG. 4, the frame 41 is disposed so as to surround the periphery of the atom cell unit 2 when viewed from the Z-axis direction. Further, as shown in FIG. 2, the thickness of the frame 41 is in the same range as the height along the Z-axis direction of the layered body formed of the atom cell 21, the optical system 23, and the spacer 28. The constituent material of the frame 41 is not particularly limited providing the material is relatively low in thermal conductivity, but nonmetal such as a resin material or a ceramics material is preferably used, and the resin material is more preferably used. In the case of forming the frame 41 mainly using the resin material, it is possible to increase the thermal resistance of the frame 41, and even in the case in which the shape of the frame 41 is complicated, the frame 41 can easily be manufactured using a known method such as injection molding.

As shown in FIG. 2 and FIG. 3, to the lower surface of such a frame 41, there is bonded the sheet 42, and to the upper surface of the frame 41, there is bonded the sheet 43.

The sheets 42, 43 are each, for example, a flexible wiring board. As shown in FIG. 4, the sheet 43 has a plurality of beam parts 431 each extending from a part bonded to the frame 41 toward the inside of the frame 41, and the connector 432 supported by the plurality of beam parts 431.

To one surface (a lower surface) of the connector 432, there is bonded the atom cell 21 with an adhesive or the like. On the other hand, to the other surface (an upper surface) of the connector 432, there is bonded the photodetector 24 via a plurality of electrically-conductive adhesives 30. Further, on the other surface (the upper surface) of the connector 432, there is also mounted the heater 25. Here, the photodetector 24 and the heater 25 are electrically connected to interconnections (not shown) provided to the connector 432. Further, the interconnections are electrically connected to the internal terminals (not shown) of the container 3 described above via at least one of the beam parts 431.

Further, the connector 432 has a pair of cutout sections 433 so as not to have contact with the thermal conductors 29 described above. It should be noted that the connector 432 traverses the passing area of the light LL in the drawings, but can have a shape excluding the passing area of the light LL.

Similarly, the sheet 42 has a plurality of beam parts 421 each extending from a part bonded to the frame 41 toward the inside of the frame 41, and a connector 422 supported by the plurality of beam parts 421.

To one surface (an upper surface) of the connector 422, there is bonded a surface of the base 281 of the spacer 28 located on the opposite side to the space S2 with an adhesive or the like. Meanwhile, on the other surface (the lower surface) of the connector 422, there is mounted the light source 22. Here, the connector 422 is provided with a hole through which the light LL from the light source 22 passes. Further, the light source 22 is electrically connected to interconnections (not shown) provided to the connector 422. Further, the interconnections are electrically connected to the internal terminals (not shown) of the container 3 described above via at least one of the beam parts 431.

Further, the connector 422 has cutout sections (not shown) similar to the pair of cutout sections 433 described above so as not to have contact with the thermal conductors 29 described above.

As described above, on the spacer 28, there is mounted the light source 22, and the relative positional relationship of the spacer 28 is fixed by the thermal conductors 29 together with the atom cell 21 and so on. Further, as described later, the sheets 42, 43 are supported by the frame 41 connected to the base 31 via the plurality of legs 44. Therefore, since the sheet 42 is bonded to the spacer 28 and at the same time the sheet 43 is bonded to the atom cell 21, it results that support 4 supports the atom cell 21, the light source 22, the photodetector 24, and so on in a lump (integrally) with respect to the base 31. It should be noted that the expression "the support 4 supports the atom cell 21, the light source 22, and the photodetector 24 in a lump with respect to the base 31" denotes the state in which the relative positions of the atom cell 21, the light source 22, and the photodetector 24 with respect to the base 31 are determined by the support 4 while putting the atom cell 21, the light source 22, and the photodetector 24 together (i.e., in a lump), and includes both of the case in which the members supported by the support 4 have contact with the base 31, and the case in which the members do not have contact with the base 31.

According to such sheets 42, 43 as described above, since the thermal resistance in the surface direction is high, the thermal conduction between the frame 41 and the atom cell unit 2 can be reduced. In particular, since the frame 41 and the atom cell unit 2 are connected to each other via the plurality of beam parts 421, 431 narrow in width, it is possible to stably support the atom cell unit 2 with respect to the frame 41, and at the same time effectively reduce the thermal conduction between the frame 41 and the atom cell unit 2.

Further, to the lower end part of the frame 41, there is connected (bonded) the plurality of legs 44 via the sheet 42. The plurality of legs 44 supports the frame 41 with respect to the base 31 so that the atom cell unit 2 is disposed at a height at which the atom cell unit 2 does not have contact with the container 3. As the constituent material of the plurality of legs 44, materials similar to the constituent material of the frame 41 described above can be used. Further, it is also possible for the plurality of legs 44 to be integrally formed with the frame 41.

The configuration of the package 10 is hereinabove described.

Such an atomic oscillator 1, which is a kind of quantum interference device, as described hereinabove is provided with the atom cell 21 in which the alkali metal atoms are encapsulated, the light source 22 for emitting the light LL for exciting the alkali metal atoms, the photodetector 24 for detecting the light LL having been transmitted through the atom cell 21, the pair of thermal conductors 29, which are disposed so as to straddle the light source 22 side and the photodetector 24 side of the atom cell 21, and are formed using the material higher in thermal conductivity than the atom cell 21, and the support 4, which is disposed so as to be separated from the pair of thermal conductors 29, formed using the material lower in thermal conductivity than the pair of thermal conductors 29, and supports the atom cell 21, the light source 22, the photodetector 24, and the pair of thermal conductors 29 in a lump.

According to such an atomic oscillator 1 as described above, since the pair of thermal conductors 29, which are formed using the material higher in thermal conductivity than the atom cell 21, is disposed so as to straddle the light source 22 side and the photodetector 24 side of the atom cell 21, it is possible to reduce the temperature difference between the surface of the atom cell 21 located on the light source 22 side and the surface located on the photodetector 24 side, and to accurately control the temperature of the light source 22 irrespective of the number and the arrangement of the heaters 25 for heating the atom cell 21, in particular, even in the case in which the number of the heaters 25 is one. Therefore, it is possible to make the characteristics of the atomic oscillator 1 excellent.

Further, since the support 4, which is formed using the material lower in thermal conductively than the pair of thermal conductors 29, supports the atom cell 21, the light source 22, the photodetector 24, and the pair of thermal conductors 29 in a lump, it is possible to achieve the miniaturization of the atomic oscillator 1, and at the same time reduce the release of the heat from the atom cell 21, the light source 22, the photodetector 24, and the pair of thermal conductors 29 to thereby achieve the reduction in power consumption of the atomic oscillator 1.

Moreover, since the support 4 is separated from the pair of thermal conductors 29, it is possible to effectively reduce the release of the heat from the pair of thermal conductors 29 to the support 4. Therefore, the effect of making the characteristics of the atomic oscillator 1 excellent by the pair of thermal conductors 29 described above, and the effect of achieving the reduction in power consumption of the atomic oscillator 1 by the support 4 described above can each be exerted in a favorable manner.

Here, the support 4 has the sheet 42 as a first support part for supporting the light source 22 on the light source 22 side with respect to the atom cell 21, and the sheet 43 as a second support part for supporting the atom cell 21 and the photodetector 24 on the photodetector 24 side with respect to the atom cell 21. Thus, it is possible to stably support the atom cell 21, the light source 22, and the photodetector 24. It should be noted that it is also possible for the sheet 42 to support the atom cell 21.

Further, the atomic oscillator 1 is provided with the heater 25, which is supported by the support 4 together with the atom cell 21, the light source 22, the photodetector 24, and the pair of thermal conductors 29 in a lump, and heats the light source 22 and the atom cell 21 via the pair of thermal conductors 29. Thus, it is possible to perform the accurate temperature control on the atom cell 21 and the light source 22 using the heat from the heater 25.

In the present embodiment, the heater 25 is disposed on the photodetector 24 side with respect to the atom cell 21. Thus, the interconnections for the heater 25 can be arranged on the same side as the interconnections for the photodetector 24. Further, as described above, even in the case in which the distance between the heater 25 and the light source 22 increases, it is possible to efficiently transfer the heat from the heater 25 to the light source 22 due to the pair of thermal conductors 29.

Further, the atomic oscillator 1 is provided with the container 3 constituting the internal space S1 as the space for housing the atom cell 21, the light source 22, the photodetector 24, the heater 25, the thermal conductors 29, and the support 4, and the thermal conductors 29 are separated from the container 3. Thus, it is possible to reduce the transfer of the heat from the atom cell 21, the light source 22, the photodetector 24, and the heater 25 to the container 3 via the thermal conductors 29.

Second Embodiment

Then, a second embodiment of the invention will be described.

Figure 5:
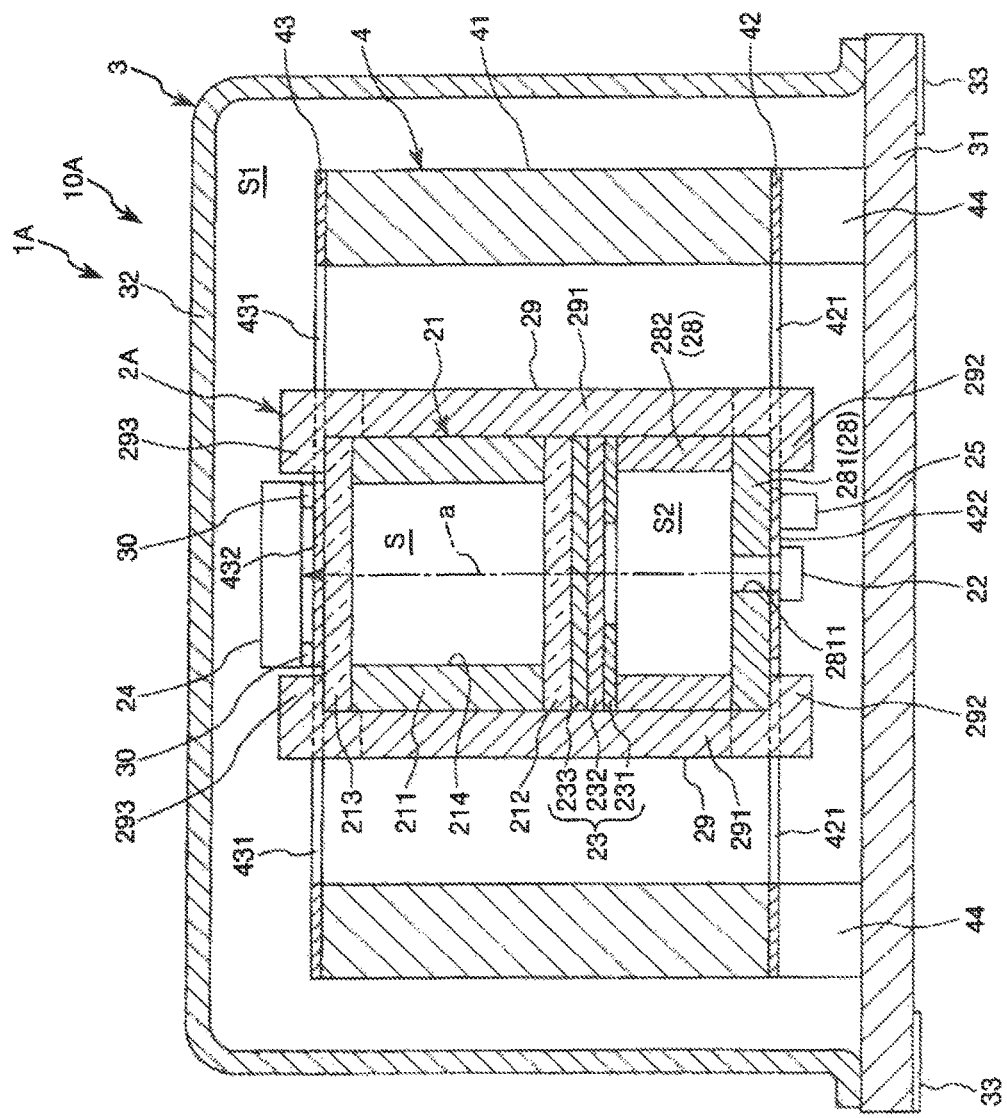
FIG. 5 is a cross-sectional view showing a schematic configuration of a package provided to an atomic oscillator according to second embodiment.
Figure 5:
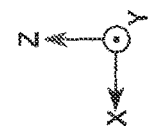

FIG. 5 is a cross-sectional view showing a schematic configuration of a package provided to an atomic oscillator according to the second embodiment of the invention.

The atomic oscillator according to the present embodiment is substantially the same as the first embodiment described above except the point that the arrangement of the heater is different.

It should be noted that in the following description, the second embodiment will be described with a focus on the difference from the embodiment described above, and the description of substantially the same issues will be omitted. Further, in FIG. 5, the constituents substantially identical to those of the embodiment described above are denoted by the same reference symbols.

The package 10A provided to the atomic oscillator 1A shown in FIG. 5 has an atom cell unit 2A supported with respect to the container 3 via the support 4. In the atom cell unit 2A has the heater 25 disposed on the opposite side of the base 281 of the spacer 28 to the frame 282. The heater 25 is electrically connected to interconnections (not shown) provided to the connector 422.

In the present embodiment, the heat from the heater 25 is transferred to the light source 22 via the base 281 of the spacer 28. Further, the heat from the heater 25 is transferred to the light transmissive parts 212, 213 of the atom cell 21 via the spacer 28 and the pair of thermal conductors 29.

As described above, the heater 25 of the atomic oscillator 1A according to the present embodiment is disposed on the light source 22 side with respect to the atom cell 21. Thus, the interconnections for the heater 25 can be arranged on the same side as the interconnections for the light source 22. Further, it is possible to decrease the distance between the heater 25 and the light source 22 to thereby perform more accurate temperature control on the light source 22. As a result, it is possible to efficiently reduce the wavelength fluctuation of the light due to the temperature fluctuation of the light source 22.

Further, the heater 25 is located at a position closer to the light source 22 than to the atom cell 21. In other words, the distance between the heater 25 and the light source 22 is shorter than the distance between the heater 25 and the atom cell 21. Thus, it is possible to make the heater 25 come closer to the light source 22 than to the atom cell 21. Therefore, it is possible to perform further accurate temperature control on the light source 22.

According also to the atomic oscillator 1A related to the second embodiment described hereinabove, the miniaturization and the reduction in power consumption can be achieved while making the characteristics excellent.

Third Embodiment

Then, a third embodiment of the invention will be described.

Figure 6:
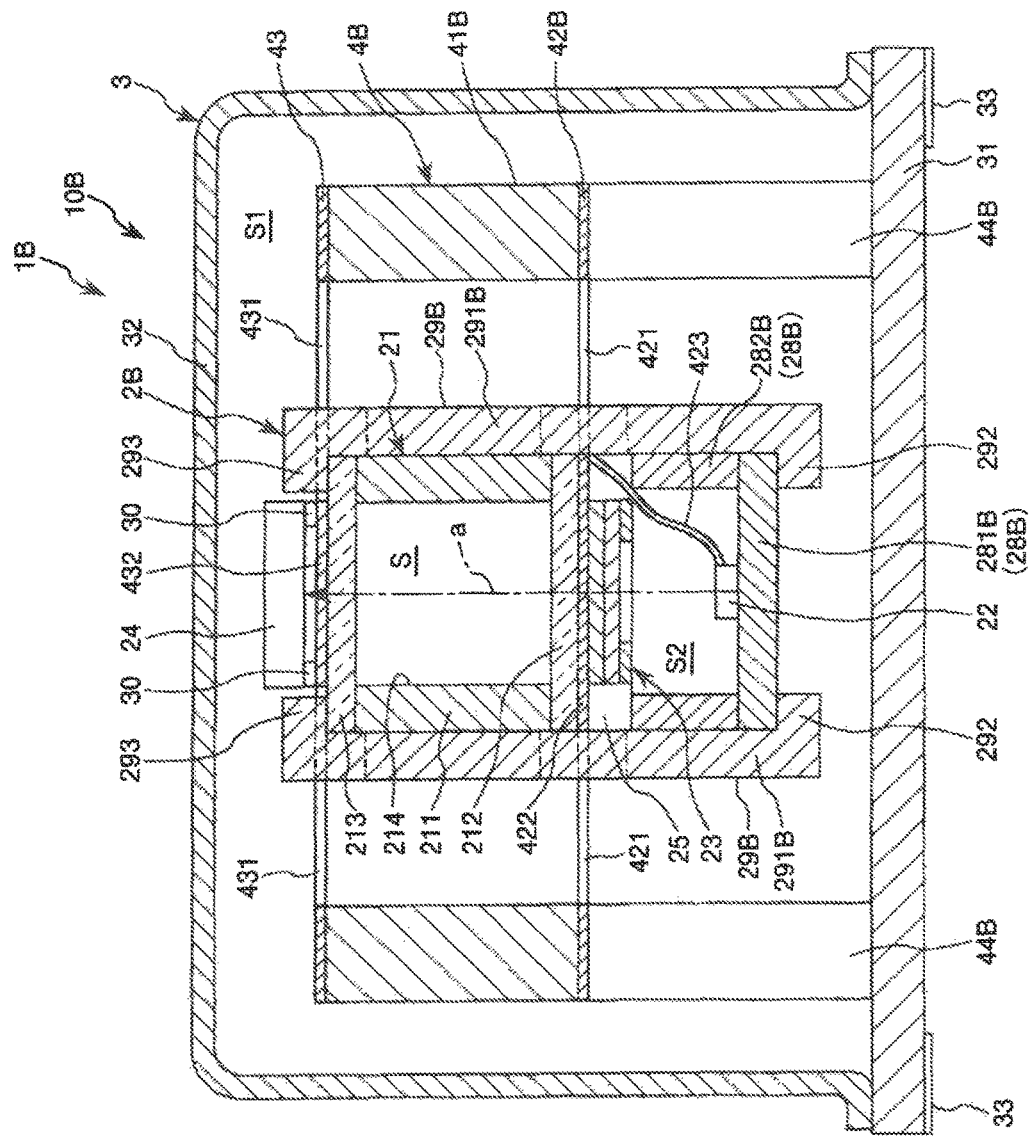
FIG. 6 is a cross-sectional view showing a schematic configuration of a package provided to an atomic oscillator according to third embodiment.

FIG. 6 is a cross-sectional view showing a schematic configuration of a package provided to an atomic oscillator according to the third embodiment of the invention.

The atomic oscillator according to the present embodiment is substantially the same as the first embodiment described above except the point that the arrangement of the heater and the configuration of the support are different.

It should be noted that in the following description, the third embodiment will be described with a focus on the difference from the embodiments described above, and the description of substantially the same issues will be omitted. Further, in FIG. 6, the constituents substantially identical to those of the embodiments described above are denoted by the same reference symbols.

The package 10B provided to the atomic oscillator 1B shown in FIG. 6 has an atom cell unit 2B and a support 4B housed in the container 3.

The atom cell unit 2B has a spacer 28B and a pair of thermal conductors 29B. The spacer 28B has a base 281B shaped like a plate, and a frame 282B erected in an outer peripheral part of the base 281B, and the space S2 is formed inside the frame 282B. Further, on the upper surface of the base 281B, there is disposed the light source 22. Further, the upper end part of the frame 282B has a shape of forming a gap with the optical system 23. Further, in the gap, there is disposed the heater 25.

The support 4B has a frame 41B, two sheets 42B, 43, and legs 44B. The thickness of the frame 41B is in the same range as the height along the Z-axis direction of the atom cell 21. To the lower surface of such a frame 41B, there is bonded the sheet 42B, and to the upper surface of the frame 41B, there is bonded the sheet 43.

The sheet 42B has the plurality of beam parts 421 each extending from a part bonded to the frame 41B toward the inside of the frame 41B, the connector 422 supported by the plurality of beam parts 421, and wiring 423 connected to the light source 22.

In the present embodiment, the connector 422 is disposed between the atom cell 21 and the optical system 23. Further, to one surface (an upper surface) of the connector 422, there is bonded a surface of the light transmissive part 212 of the atom cell 21 with an adhesive or the like. Further, on the other surface (the lower surface) of the connector 422, there is mounted the heater 25. Here, the heater 25 is electrically connected to interconnections (not shown) provided to the connector 422. It should be noted that the connector 422 traverses the passing area of the light LL in the drawings, but can also be formed so as to exclude the passing area of the light LL.

The wiring 423 extends from the beam 421 or the connector 422 to the space S2 through the gap formed by the spacer 28B described above so as not to have contact with the spacer 28B and the first part 291B of each of the pair of thermal conductors 29B. Then, the wiring 423 is connected to the light source 22.

Further, to the lower end part of the frame 41B, there is connected the plurality of legs 44B via the sheet 42B. The plurality of legs 44B supports the frame 41B with respect to the base 31 so that the atom cell unit 2B is disposed at a height at which the atom cell unit 2B does not have contact with the container 3.

As described above, the support 4B of the atomic oscillator 1B according to the present embodiment has the sheet 42B as a first support part for supporting the atom cell 21 on the light source 22 side with respect to the atom cell 21, and the sheet 43 as a second support part for supporting the atom cell 21 and the photodetector 24 on the photodetector 24 side with respect to the atom cell 21. According also to such a support 4B, it is possible to stably support the atom cell 21, the light source 22, and the photodetector 24.

Further, the heater 25 is disposed on the light source 22 side with respect to the atom cell 21. Thus, the interconnections for the heater 25 can be arranged on the same side as the interconnections for the light source 22. Further, it is possible to decrease the distance between the heater 25 and the light source 22 to thereby perform more accurate temperature control on the light source 22. As a result, it is possible to efficiently reduce the wavelength fluctuation of the light due to the temperature fluctuation of the light source 22.

In the present embodiment, the heater 25 is located at a position closer to the atom cell 21 than to the light source 22. In other words, the distance between the heater 25 and the light source 22 is longer than the distance between the heater 25 and the atom cell 21. Thus, it is possible to dispose the heater 25 in the vicinity of the center of the atom cell unit 2B, which is a layered body including the atom cell 21 and the light source 22. Therefore, it is possible to easily homogenize the temperature distribution between the surface of the atom cell 21 located on the light source 22 side, the surface of the atom cell 21 located on the photodetector 24 side, and the light source 22.

Further, the atomic oscillator 1B is provided with the wiring 423 connected to the light source 22. Here, the pair of thermal conductors 29B are disposed outside the space S2 housing the light source 22. Further, the wiring 423 extends from the sheet 42B as the first support part to the inside of the space S2 so as to be separated from the thermal conductors 29B, and is connected to the light source 22. Thus, it is possible to reduce the radiation from the wiring 423 for the light source 22. The reason is that since the wiring 423 is located inside the space S2, the thermal conductor 29B intervenes between the wiring 423 and the container 3, and further, since the wiring 423 is separated from the thermal conductor 29B, the temperature difference between the wiring 423 and the thermal conductor 29B is reduced. As a result of the reduction of the radiation from the wiring 423 described above, it is possible to efficiently achieve the reduction in power consumption of the atomic oscillator 1B.

According also to the atomic oscillator 1B related to the third embodiment described hereinabove, the miniaturization and the reduction in power consumption can be achieved while making the characteristics excellent.

Fourth Embodiment

Then, a fourth embodiment of the invention will be described.

Figure 7:
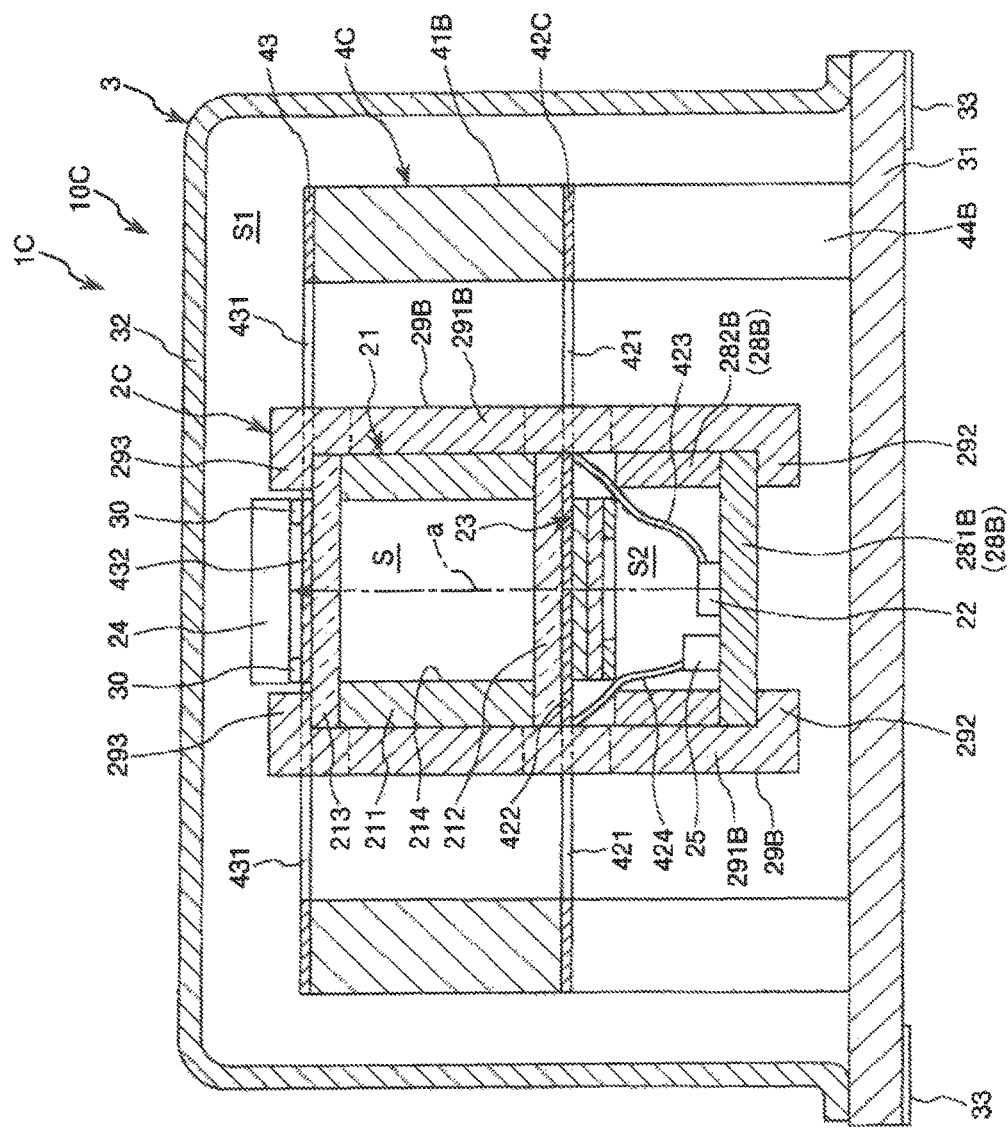
FIG. 7 is a cross-sectional view showing a schematic configuration of a package provided to an atomic oscillator according to fourth embodiment.

FIG. 7 is a cross-sectional view showing a schematic configuration of a package provided to an atomic oscillator according to the fourth embodiment of the invention.

The atomic oscillator according to the present embodiment is substantially the same as the first embodiment described above except the point that the arrangement of the heater and the configuration of the support are different. Further, the atomic oscillator according to the present embodiment is substantially the same as the third embodiment described above except the point that the arrangement of the heater is different.

It should be noted that in the following description, the fourth embodiment will be described with a focus on the difference from the embodiments described above, and the description of substantially the same issues will be omitted. Further, in FIG. 7, the constituents substantially identical to those of the embodiments described above are denoted by the same reference symbols.

A package 10C provided to the atomic oscillator 1C shown in FIG. 7 has an atom cell unit 2C and a support 4C housed in the container 3.

The atom cell unit 2C is substantially the same as the atom cell unit 2B in the third embodiment described above except the point that the heater 25 is disposed on the base 281B of the spacer 28B.

The support 4C has the frame 41B, two sheets 42C, 43, and the legs 44B. To the lower surface of the frame 41B, there is bonded the sheet 42C. The sheet 42C has the wiring 423 connected to the light source 22 and wiring 424 connected to the heater 25.

The wiring 424 extends from the beam 421 or the connector 422 to the space S2 through the gap formed by the spacer 28B described above so as not to have contact with the spacer 28B and the pair of thermal conductors 29B. Then, the wiring 424 is connected to the heater 25.

As described above, the atomic oscillator 1C according to the present embodiment is provided with the wiring 424 connected to the heater 25. Here, the pair of thermal conductors 29B are disposed outside the space S2 housing the heater 25. Further, the wiring 424 extends from the sheet 42C as the first support part to the inside of the space S2 so as to be separated from the thermal conductors 29B, and is connected to the heater 25. Thus, it is possible to reduce the radiation from the wiring 424 for the heater 25. As a result, the reduction in power consumption of the atomic oscillator 1C can effectively be achieved.

According also to the atomic oscillator 1C related to the fourth embodiment described hereinabove, the miniaturization and the reduction in power consumption can be achieved while making the characteristics excellent.

2. Electronic Apparatus

Such an atomic oscillator equipped with the quantum interference device according to the invention as described hereinabove can be incorporated in a variety of electronic apparatuses.

An example of the electronic apparatus equipped with the quantum interference device according to the invention will hereinafter be described.

Figure 8:
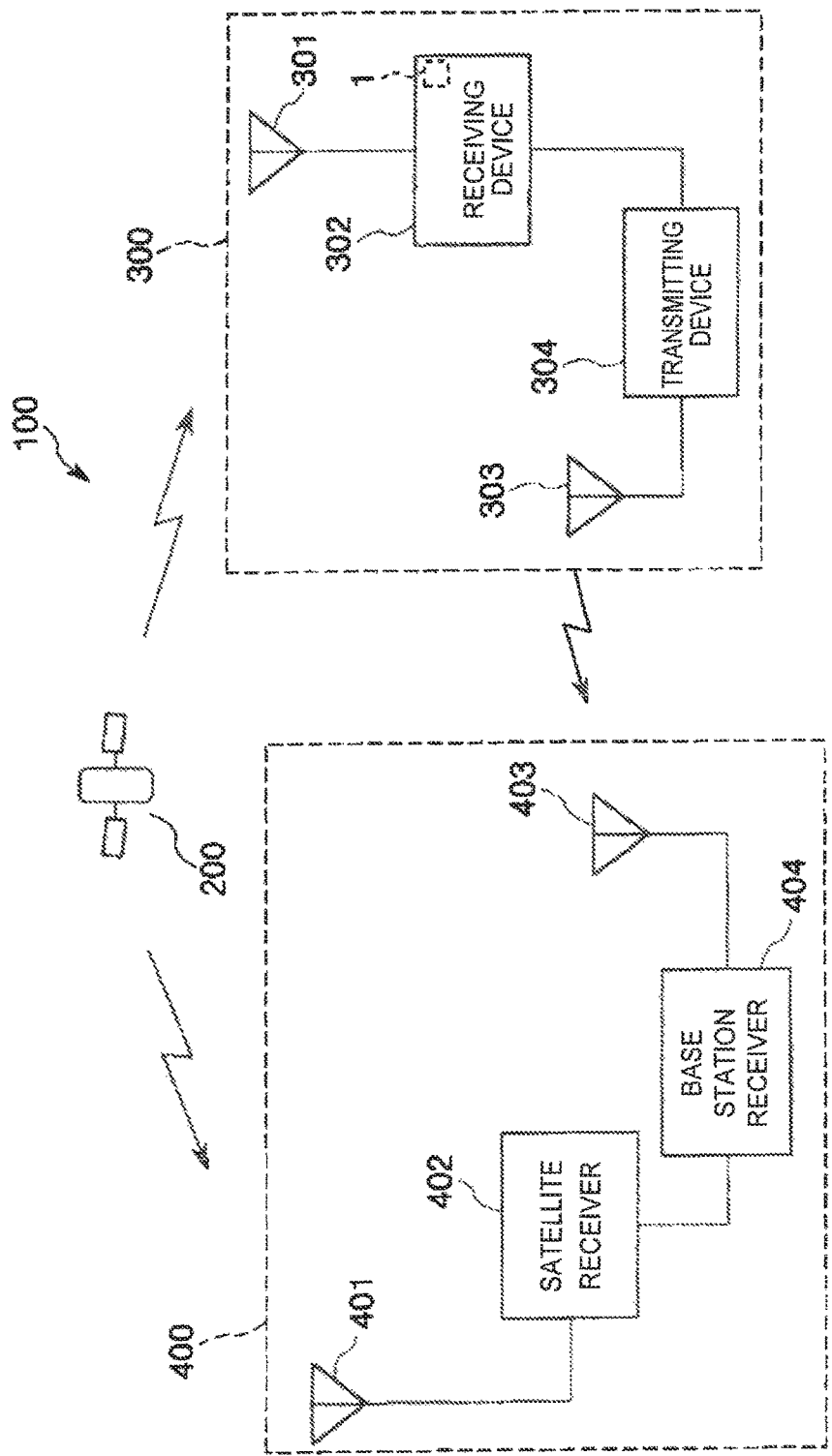
FIG. 8 is a diagram showing a schematic configuration in the case of using the atomic oscillator according to embodiments in a positioning system using a GPS satellite.

FIG. 8 is a diagram showing a schematic configuration in the case of using the atomic oscillator according to the invention to a positioning system using a GPS satellite.

The positioning system 100 shown in FIG. 8 is constituted by the GPS satellite 200, a base station device 300, and a GPS receiving device 400.

The GPS satellite 200 transmits positioning information (a GPS signal).

The base station device 300 is provided with a receiving device 302 for accurately receiving the positioning information from the GPS satellite 200 via an antenna 301 installed at, for example, an electronic reference point (a GPS continuous observation station), and a transmitting device 304 for transmitting the positioning information, which has been received by the receiving device 302, via an antenna 303.

Here, the receiving device 302 is an electronic device equipped with the atomic oscillator 1 according to the invention described above as a reference frequency oscillation source for the receiving device 302. Such a receiving device 302 has excellent reliability. Further, the positioning information having been received by the receiving device 302 is transmitted by the transmitting device 304 in real time.

The GPS receiving device 400 is provided with a satellite receiver 402 for receiving the positioning information from the GPS satellite 200 via an antenna 401, and a base station receiver 404 for receiving the positioning information from the base station device 300 via an antenna 403.

Since the receiving device 302 as an example of the electronic apparatus of the positioning system 100 as described above is equipped with the atomic oscillator 1 as a kind of quantum interference device, it is possible to achieve the reduction in power consumption of the atomic oscillator 1 while making the characteristics of the atomic oscillator 1 excellent.

It should be noted that, the electronic apparatus according to the invention is not limited to those described above, and as the electronic apparatus according to the invention, there can be cited, for example, a smartphone, a tablet terminal, a timepiece, a cellular phone, a digital still camera, an inkjet ejection device (e.g., an inkjet printer), a personal computer (a mobile personal computer and a laptop personal computer), a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), a flight simulator, digital terrestrial broadcasting equipment, and a cellular phone base station.

3. Vehicle

Further, the atomic oscillator equipped with such a quantum interference device according to the invention as described above can be incorporated in a variety of vehicles.

Hereinafter, an example of the vehicle according to the invention will be described.

Figure 9:
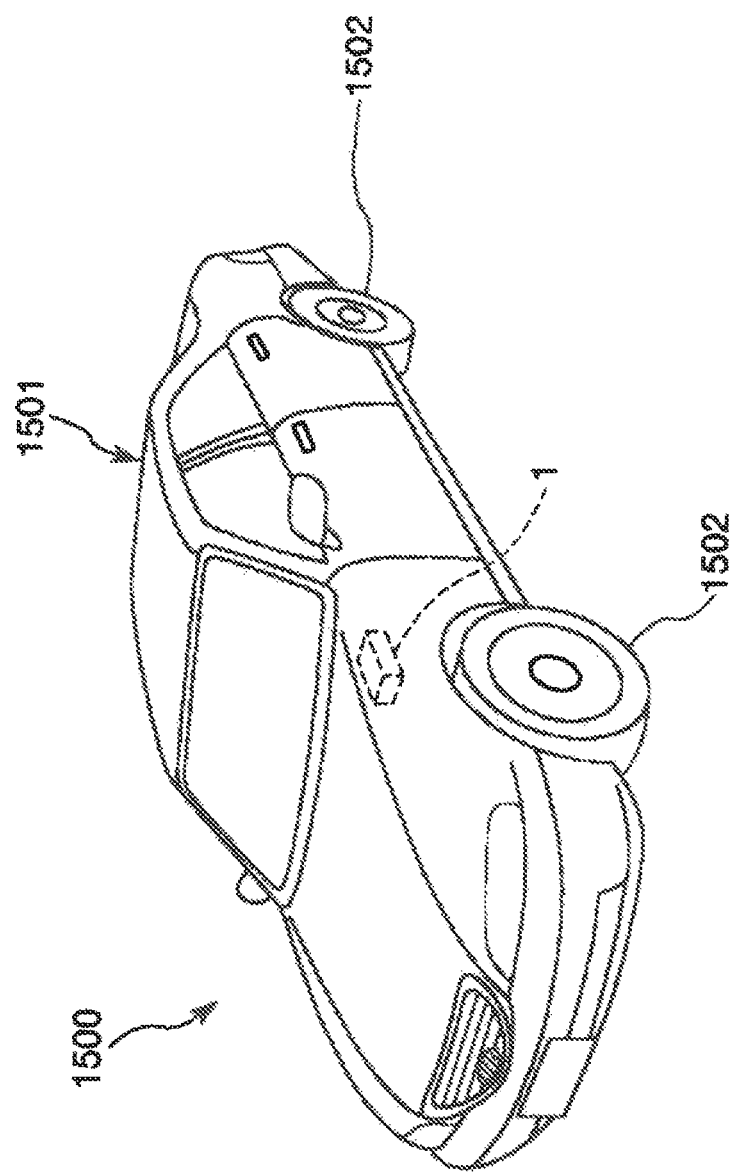
FIG. 9 is a perspective view showing a configuration of a vehicle (a car) equipped with the atomic oscillator according to the embodiments.

FIG. 9 is a perspective view showing a configuration of a vehicle (a car) equipped with the quantum interference device according to the invention.

The vehicle 1500 shown in FIG. 9 has a vehicle body 1501, and four wheels 1502, and is configured so as to rotate the wheels 1502 by a power source (an engine) not shown provided to the vehicle body 1501. Such a vehicle 1500 incorporates the atomic oscillator 1. Further, a controller not shown, for example, controls the drive of the power source based on the oscillation signal from the atomic oscillator 1.

Since the vehicle 1500 as described above is equipped with the atomic oscillator 1 as a kind of quantum interference device, it is possible to achieve the reduction in power consumption of the atomic oscillator 1 while making the characteristics of the atomic oscillator 1 excellent.

Although the quantum interference device, the atomic oscillator, the electronic apparatus, and the vehicle according to the invention are hereinabove described based on the embodiments shown in the accompanying drawings, the invention is not limited to these embodiments, but the configuration of each of the elements of the embodiments described above can be replaced with one having an arbitrary configuration with an equivalent function, or can also be added with an arbitrary configuration.

What is claimed is:

1. A quantum interference device comprising:
   an atom cell in which alkali metal atoms are encapsulated;
   a light source emits light adapted to excite the alkali metal atoms;
   a photodetector that detects the light transmitted through the atom cell;
   a thermal conductor, which is disposed so as to straddle the light source side and the photodetector side of the atom cell, the thermal conductor having higher thermal conductivity than the atom cell; and
   a support, which is disposed so as to be separated from the thermal conductor, and supports the atom cell, the light source, the photodetector, and the thermal conductor in a lump, the support having lower thermal conductivity than the thermal conductor, wherein
   the support includes
      a frame that extends between the light source side and the photodetector side of the atom cell,
      a first support part that is disposed on the light source side with respect to the atom cell, that extends from the frame toward the atom cell, and that supports one of the atom cell and the light source, and
      a second support part that is disposed on the photodetector side with respect to the atom cell, that extends from the frame toward the atom cell, and that supports one of the atom cell and the photodetector.

2. The quantum interference device according to claim 1, further comprising:
   a heater supported by the support together with the atom cell, the light source, the photodetector, and the thermal conductor in a lump, and heats the light source and the atom cell via the thermal conductor.

3. The quantum interference device according to claim 2, wherein
   the heater is disposed on the photodetector side with respect to the atom cell.

4. The quantum interference device according to claim 2, wherein
   the heater is disposed on the light source side with respect to the atom cell.

5. The quantum interference device according to claim 4, wherein
   a distance between the heater and the light source is shorter than a distance between the heater and the atom cell.

6. The quantum interference device according to claim 4, wherein
   a distance between the heater and the light source is longer than a distance between the heater and the atom cell.

7. The quantum interference device according to claim 2, wherein
   the thermal conductor is disposed outside a space housing one of the heater and the light source, and
   the quantum interference device further comprising a wiring that has a part extending from the first support part to an inside of the space so as to be separated from the thermal conductor, and connected to one of the heater and the light source.

8. The quantum interference device according to claim 2, further comprising:
   a container that houses the atom cell, the light source, the photodetector, the heater, the thermal conductor, and the support,
   wherein the thermal conductor is separated from the container.

9. An atomic oscillator comprising:
   the quantum interference device according to claim 1.

10. An electronic apparatus comprising:
    the quantum interference device according to claim 1.

* * * * *